United States Patent [19]

Menard et al.

[11] Patent Number: 5,529,878
[45] Date of Patent: Jun. 25, 1996

[54] COLOR PROOFING SYSTEM

[75] Inventors: Gilles Menard, Taverny, France; Wallace R. Lundquist, Oakdale, Minn.

[73] Assignee: Minnesota Mining and Manufacturing Company, St. Paul, Minn.

[21] Appl. No.: 447,123

[22] Filed: May 22, 1995

[51] Int. Cl.$^6$ .......................... G03C 11/12; G03C 1/805
[52] U.S. Cl. .......................... 430/143; 430/156; 430/166; 430/257
[58] Field of Search ................................ 430/143, 257, 430/156, 166

[56] References Cited

U.S. PATENT DOCUMENTS

| | | | |
|---|---|---|---|
| 4,260,673 | 4/1981 | Krech | 430/143 |
| 4,659,642 | 4/1987 | Platzer et al. | |
| 4,772,533 | 9/1988 | Platzer et al. | |
| 4,937,168 | 6/1990 | Platzer | |
| 4,948,693 | 8/1990 | Shadrach et al. | |
| 5,094,931 | 3/1992 | Platzer | |
| 5,192,630 | 3/1993 | Platzer | |
| 5,240,810 | 8/1993 | Barjesteh | |

FOREIGN PATENT DOCUMENTS

0365360A2  4/1990  European Pat. Off.

OTHER PUBLICATIONS

Abstract of EP 352055A—Photosensitive Element.
Abstract of US 4,895,787—Coloured Image.
Abstract of US 5,212,041 of May 18, 1993—Negative-Working, Photosensitive, Overlay, Colour Proofing Film.
Abstract of US 4,914,039 of Apr. 3, 1990—Negative-Working, Photosensitive, Overlay Colour Proofing Film.
Abstract of US 4,929,532 of May 29, 1990—Forming a Coloured Image.
Abstract of US 5,053,310 of Oct. 1, 1991—Colour Image Production Using Light-Sensitive Material.
Abstract of 9005 GB 2193334—Forming a Coloured Image.
Abstract of US 4,933,258 of Jun. 12, 1990—Photosensitive Image Receptive Material with Photopolymerisable Adhesive Layer Over Peelable Layer.
Abstract of EP534479A1 of Mar. 31, 1993—Electrographic Material for Color Proofing.
Abstract of EP209105A2 of Jan. 21, 1987.

*Primary Examiner*—Thorl Chea
*Attorney, Agent, or Firm*—Gary L. Griswold; Walter N. Kirn; Mark A. Litman

[57] ABSTRACT

A presensitized color proofing sheet and method of obtaining an image on a paper substrate is disclosed herein. The color proofing sheet is comprised of a color layer, an optional barrier layer, both being light sensitive, and non-light sensitive solvent resistant adhesive layer with the barrier layer being present to provide a means of eliminating residual toning between adjacent layers in the structure.

32 Claims, 1 Drawing Sheet

COLOR PROOFING SYSTEM

BACKGROUND OF THE INVENTION

1. Field of the Invention

This Invention relates to radiation-sensitive elements for colored image reproduction and more particularly to elements wherein positive images are formed on paper substrates for the purposes of proofing the color separations of original, multi-colored, renditions of graphic art.

2. Description of the Prior Art

In the photomechanical process of reproducing the tone values and color shades represented by a piece of original graphic art, it is desirable to prepare a series of color separations so that the particular colors to be printed are first recorded on a set of separation negatives or positives by means of appropriate filtering and masking techniques. These separations were originally done by photographic film, but can now be created by various imaging technologies and even electronic data storage separations are used.

Traditionally the color separations are formed by following known imaging procedures. For example, four photographic black and white separation negatives or positives are made representing the three process colors, magenta, cyan and yellow as well as a fourth representing the black contribution. These separations are then used to make four printing plates. These plates are then mounted on an offset printing press to recreate a rendition of the original piece of art.

In some instances, the printing press is not faithful in its reproduction of the copy carried by the printing plates because of inherent limitations in the printing process. In other instances, the buyer of the printed copy may desire changes in tonal values so that the printed matter as represented by the output of the press is more satisfying to his customers. For these reasons and others, a method of previewing the results before actually printing the subject matter has been devised whereby the changes and adjustments may be made to the separation transparencies prior to the manufacture of the printing plates.

One method of previewing the color separation of an original colored piece of art work is disclosed in U.S. Pat. No. 3,136,637. This patent discloses the use of a multiple layered negative acting proofing system. In this system each of the colored sheets which have been exposed with the appropriate separation negative are developed and then superimposed one on top of the other in exact register. These transparent sheets containing the colored images in exact detail can then be examined individually or in total to recognize any deficiencies compared to the original piece of graphic art prior to the manufacture of the printing plates.

In U.S. Pat. No. 3,671,236, the same objective as above is attained by superimposing on a single substrate the several colored layers so that the composite structure more closely resembles the final printed specimen. This process is again a negative acting system wherein a lithographic negative is the means whereby the information is transferred photomechanically to the colored proofing sheets.

Still another proofing system is disclosed in U.S. Pat. No. 2,993,788 wherein a lithographic negative is used to expose a positive acting diazo oxide sensitized substrate. By exposing, developing and the application of a dye of predetermined color using the non-exposed portions of the diazo oxide as a photomask, a single sheet, negative acting proofing composition is attained.

A particular problem which often occurs in the preparation of photomechanical proofs is that special receptor layers may be needed for accepting the highest quality proofing systems. Because special receiving layers are needed, the image can not easily duplicate the image printed on paper stock or specialty papers because the background of the receptor layer does not duplicate the background color and tone of the paper layer on which the printing is to be performed.

In some systems, such as those described in U.S. Pat. Nos. 5,240,810; 5,192,630; and 5,094,931 require special adhesive layers that are separately laminated or coated onto paper stock. In addition these systems require multiple transfer of the image between receptors. Different imaging systems may have to be used for conventional receptor sheets and systems using paper as the receptor. The use of additional adhesive layer on the receptors also can increase dot gain. The transfer process also limits the lower weight limit of the paper upon which the image may be transferred. Lower weight papers have a tendency to tear, wrinkle or curl. Although this feature can be desirable in certain circumstances, it is also undesirable at many times.

U.S. Pat. No. 4,260,673 describes a presensitized color proofing sheet comprising a carrier sheet having a smooth release surface. Coated onto the release surface of the carrier sheet in a clinging engagement is a color coating of a mixture of a diazo oxide and a pigmented base soluble resin compound. By clinging engagement it is meant that the release value is between 2–60 grains per 2 lineal inches, with between 4 to 20 being preferred, as tested by the procedures described in TAPPI (Technical Association for the Pulp and Paper Industry), vol. 43, No. 8, pp. 164A and 165A (August 1960).

Bonded to the top of this color coating is a discrete barrier layer of a mixture of a base soluble resin and a diazo oxide. Both the barrier layer and the color coating are solubilizable in an aqueous alkali developing medium upon exposure to actinic radiation but not solubilizable in the developing medium prior to exposure to actinic radiation. Firmly attached to the barrier is a clear adhesive layer which is insolubilizable in the development medium. This system, although commercially effective on special receptor sheets, does not offer the flexibility of use on both special receptors and conventional or unconventional paper stock.

SUMMARY OF THE INVENTION

The presensitized color proofing element of the present invention is comprised of a carrier sheet having a smooth release surface. Coated onto the release surface of the carrier sheet in a clinging engagement is a photosensitive color layer comprising a mixture of a diazo oxide and a pigmented base soluble resin compound.

Bonded to the top of the photosensitive color layer is an optional discrete barrier layer comprising a mixture of a base soluble resin and a diazo oxide. Both the barrier layer and the photosensitive color layer are solubilizable in an aqueous alkali developing medium upon exposure to actinic radiation but not solubilizable in the developing medium prior to exposure to actinic radiation. Over the barrier layer is a thermal adhesive layer comprising a thermoplastic or pressure sensitive adhesive. Preferably, the adhesive composition comprises a thermoplastic acrylic resin.

To obtain a multi-colored color proofing composite on a paper substrate, a paper substrate is placed over a conventional receptor sheet comprising a water impermeable paper or polymeric film base. The paper substrate must have all dimensions in its major surfaces (i.e., its length and width, but not necessarily its thickness) smaller than the dimensions of the receptor sheet. The reason for this will become apparent in later explanations of the invention. The paper substrate may be simply placed onto the receptor. Alternatively, prior to the placement of the paper onto the receptor sheet, a prime layer or film of adhesive may be coated or laminated onto the receptor sheet. The paper may then be bonded to the receptor by the adhesive on the receptor sheet. This additional prime layer will not interfere with dot gain as it is below the paper stock which is opaque for imaging purposes. The adhesive layer of a first presensitized element of the aforementioned prepress proofing element construction (usually the cyan colored element) is bonded to the paper covered receptor and the carrier removed. The dimensions of the prepress proofing element must also be greater than those of the major face of the paper substrate. The adhesive on the proofing element then bonds to the primed surface of the receptor sheet outside of the dimensions of the paper substrate, thus encapsulating the paper substrate between the receptor sheet and the prepress proofing element. The laminated structure comprising the receptor sheet, paper and the presensitized proofing element bonded thereto is then exposed to actinic radiation through a color separation positive film corresponding to the primary color of the photosensitive color layer. The carrier sheet of the laminated structure may be removed prior to or after exposure. The exposed diazo oxide and resin mixture in the photosensitive color layer and optional barrier layer is rendered soluble to an aqueous alkali developing medium to create a latent image. The lamination of the paper between the layers prevents any liquid developer from contacting and attacking the paper or wicking through the paper to undercut the image produced on the prepress proofing element.

The latent image may then be developed with an aqueous alkali developing medium whereby the exposed diazo oxide and resin mixture in the photosensitive color layer and associated optional barrier layer is removed leaving the unexposed diazo oxide and resin.

The aforementioned process is repeated in sequence and in register so that the composite proof contains colored layers representing the magenta, cyan, yellow and black contributions of the original subject matter. Conventional prepress proofing elements may be used for the subsequent color layers. These subsequent layers do not have to have dimensions which exceed those of the paper substrate which has already been laminated or encapsulated within protective layers.

It will be recognized by one skilled in the art that those colored portions of each of the overlying layers remaining on the sheet after development still remain light sensitive and should developing liquids come in contact with these sections representing the imaged element, after having been exposed to ambient light, that they too would be removed, thus destroying the composite's use as a proofing system.

In the present invention, the lamination or encapsulation of the paper substrate prevents wicking of developer through the paper, and the developer resistant adhesive layer composed as part of the subsequent presensitized color proofing element to be imaged, provides protection for the already imaged and developed presensitized color layer and optional barrier layer of the laminated structure.

BRIEF DESCRIPTION OF THE DRAWINGS

The manner in which this invention functions will become apparent from reference to the drawing and to the specific examples which follow.

DETAILED DESCRIPTION OF THE INVENTION

The method of the present invention forms a color proof using a presensitized color proofing element, the element comprising:

a carrier sheet having a smooth release surface;

a photosensitive color layer comprising a diazo oxide and a pigmented resin compound in clinging engagement with but not adhesively bonded to said release surface of said carrier sheet;

an optional barrier layer comprising a mixture or reaction product of a resin and a diazo oxide bonded to the surface of said color layer; said photosensitive color layer and said barrier layer being solubilizable in an aqueous alkali developing medium upon exposure to actinic radiation but not solubilizable in the developing medium prior to exposure to actinic radiation; and a clear adhesive layer firmly attached to said photosensitive color layer or optional barrier layer, said adhesive layer comprising a thermoplastic or pressure sensitive adhesive being insoluble in said aqueous alkali development medium, preferably said adhesive is an acrylic thermoplastic resin, the process comprising the steps of providing a receptor sheet, placing a paper substrate on said receptor sheet so that continuous areas of said receptor sheet extend completely around said paper substrate, exposing at least two millimeters of receptor sheet past all edges of said paper substrate, applying said presensitized proofing element over said paper substrate to form an unbonded structure so that continuous areas of said proofing element extend completely around said paper substrate, exposing at least two millimeters of said proofing element to said receptor sheet, heating and pressing said unbonded structure to adhere exposed areas of said proofing element to the paper substrate and exposed areas of said receptor sheet. The receptor sheet is preferably of greater dimensions than the proofing element to prevent adherence of the receptor sheet to any elements used during lamination.

The above method performs best according to the present invention when said adhesive layer comprises an acrylic resin and most preferably a copolymer of at least two monomers selected from the group consisting of acrylic acid, methacrylic acid, methylmethacrylate, ethylmethacrylate, iso-propylmethacrylate, n-butylmethacrylate, isobutylmethacrylate, and isobutylacrylate. The areas around the encapsulated paper substrate should extend beyond the outermost edge of the paper by at least 2 mm, preferably at least 3 mm, more preferably at least 4 mm, and most preferably at least 5 mm, with up to 5–10 cm commonly used (although the largest or larger amounts tend to waste more of the imaging area of the proofing sheet).

Figure 1:
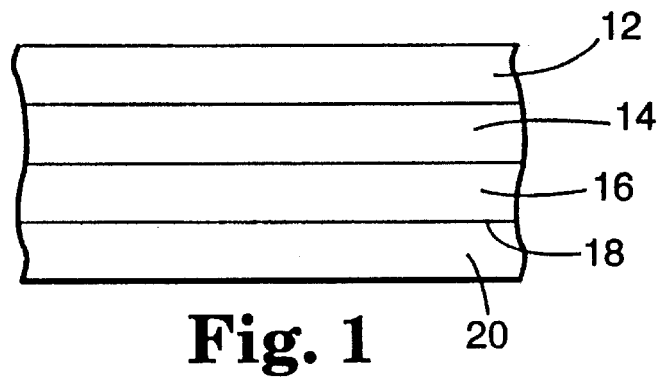
FIG. 1, shows a broken away edge view of a photosensitive color proofing element.

Referring to FIG. 1, a carrier sheet 20 is provided with a release surface 18 which may either be a smooth surface of the carrier itself or a surface release coating thereon. If a release coating is used, then the surface of the carrier need not be smooth. The function of release surface 18 is to serve as a parting layer between the carrier sheet 20 and the photosensitive color layer 16. Carrier sheet 20 may be made of numerous materials which are known in the art. The preferred carrier for use in the present invention is a 0.05 mm (2 mil) thick polyester film having a release surface 18 consisting of a release coating.

The release coating releases from the carrier and clings to the photosensitive color layer after lamination to a receiving structure and subsequent removal of the carrier. The release layer is coated onto the carrier using an aqueous solution of water soluble resins. Preferred water soluble resins non-exclusively include alkyl ethers of cellulose, polyvinyl alcohols and polyvinyl pyrrolidone. The release properties of the layer may be controlled by the incorporation of a water soluble surfactant. Preferred surfactants non-exclusively include alkylarylpolyether alcohols, glycerin and ethoxylated castor oil. In the preferred embodiment, the surfactant is present in the release layer in the amount of 0.1–5% by weight of solids in the layer, more preferably 0.5–2%. Other ingredients may be added such as mold inhibitors, antihalation dyes, filter dyes, solvents, wetting agents, rheology modifiers, etc.

Photosensitive color layer 16 comprises a light sensitive, positive-acting diazo oxide dispersed in a base soluble organic resinous binder system in which a pigment or dye representing one of the process colors used in the printing of four color lithography has been dispersed. An o-quinone diazide or other positive-acting diazo oxide is mixed with, dissolved in, or pendant to the binder. The diazo oxide must be soluble or otherwise present in amounts of at least 10% by weight in the organic polymeric resin binder. Preferred diazo oxides include ester derivatives of 2-diazo-1-naphthol-5-sulfonic acid with dihydroxybenzophenone, trihydroxybenzophenone and t-butyl phenol. Preferred polymers for this layer are phenolic resins including both resols and novalaks. Base soluble acrylic resins and styrene maleic anhydride half ester copolymers are also useful. Other polymeric materials, such as polyvinylbutyral, may be added with the binder to adjust physical properties. Crosslinked epoxy or polyurethane resins may be added as may polyisocyanates (or other epoxy resin crosslinking agents) and monoisocyanates to react with the phenolic resin or other polymer constituents.

Overlying photosensitive color layer 16 is an optional barrier layer 14 comprising a resin and a diazo oxide mixture or reaction product whose function is to provide for clean release of photosensitive color layer 16. By maintaining discrete barrier and photosensitive color layers toning is eliminated because the barrier layer is free of colorants. As a result when barrier layer 14 is exposed through a positive separation film and developed out simultaneously with photosensitive color layer 16, it effectively removes any background staining or residual color which otherwise would have been attached to the clear adhesive layer 12. Barrier layer 14, in its non-exposed state, is a clear film containing little or no optical haze and so does not detract from the color remaining in the imaged area.

Barrier layer 14 is coated from a solvent system that will minimize the penetration of the resinous barrier layer 14 into photosensitive color layer 16. The ultimate selection of the solvent system is greatly influenced by the drying conditions which will be utilized. It has been found that solvent such as the lower molecular weight alcohols, e.g., methanol, ethanol, n-propyl and isopropyl alcohol, are satisfactory in most cases.

Because of the acidic nature of the diazo oxides after exposure to actinic radiation, an aqueous alkaline developer is required to bring forth the latent image. So as to facilitate the activity of the developer, the resins used in dried layers 14 and 16 should be only slightly penetrable by the aqueous alkaline developer. Examples of such resins are the phenol-formaldehyde novalak resins and other similar resins with sufficient carboxy or hydroxy functionality to allow for penetration by an aqueous base.

Alternatively barrier layer 14 may be the reaction product of an alkali-solution of a phenol formaldehyde resin (e.g., Resinox™ available from Borden Chemical Co.) and 2-diazo-1-naphthol-5-sulfonyl chloride. The reaction product has been found to give a greater latitude in the choice of developers because of its resistance to attack. Further the reaction product has been found to have greater resistance to solvents used for coating the adhesive layer 12 which enables barrier layer 14 to retain a discrete character.

Adhered to barrier layer 14 is a developer resistant adhesive layer 12, whose function is to bond the exposed and developed element to a receptor, as well as to protect the image areas of the first laid down color from subsequent development by developer when the second, third and fourth colors are positioned in place and in register. Because the positive acting diazo oxide containing image portions of a particular photosensitive color layer 16 and barrier layer 14 are still light sensitive after developing away the exposed portions, adhesive layer 12 acts to protect previously formed image(s) from deterioration due to developer penetration. Adhesive layer 12 must also act to encapsulate the paper substrate 32 (shown in FIG. 2) on the receptor sheet 30 (also shown in FIG. 2).

Adhesive layer 12 comprises a thermally activated adhesive which is coated on the top surface of the optional barrier layer 14 or photosensitive color layer 16. The adhesive has been described in U.S. Pat. Nos. 4,260,673 and 4,889,787 as preferably a thermally activated type that are softenable at a temperature of less than 200° C., preferably within a range between 100° C. and 160° C. In contrast with the softening characteristics of the adhesive it is desirable that the adhesive not block during storage or shipment. Resins having a Tg between 45° C. and 60° C., including copolymers of acrylic and/or methacrylic monomers with styryl monomers, meet both the lamination criteria and avoid the potential for blocking, without requiring the use of an additional protective liner. Useful resins include polymers and copolymers of methyl methacrylate, n-butyl methacrylate, n-butyl/isobutyl methacrylate, polyvinylacetates and polystyrenes. Latexes may also be used, but due to the presence of the emulsifiers there may be a tendency to attack photosensitive color layer 16, so special care in the selection must be taken. The styrene/acrylate resins having a Tg between 45° C. and 60° C. may form brittle films when formulated by themselves. In order to flexibilize the layer it is useful to incorporate plasticizers and/or a soft resin. Phthalate and phosphate plasticizers (i.e., Santicizer™ 278, Santicizer™ 148 and Santicizer™ 160, available from Monsanto Corp., St. Louis, Mo.) or poly(methyl vinyl ethers) (i.e., Gantrez™ M555, available from ISP Technologies Inc., Wayne, N.J. or Lutonal™M40, available from BASF Corp. Chemicals Division, Parsippany, N.J.), generally are very useful as flexibilizers.

The aforementioned resins may be coated from solutions wherein the solvents are straight chain hydrocarbons ($C_2$ to $C_6$) as well as saturated and aromatic cyclic hydrocarbons, e.g. cyclohexane, toluene, etc. The adhesive surface of the adhesive layer 12 may be protected from contamination by dirt or grease, by a protective release liner (not shown) made of materials such as silicone coated paper and the like.

In order to give the materials more slip, silica or polyethylene can be incorporated into the adhesive formulation. The addition of slip agents prevent the proofing elements from blocking in storage or shipment and also allow the elements to slide over each other more readily thus making it easier to pull individual elements out of a stack during normal handling.

Figure 2:
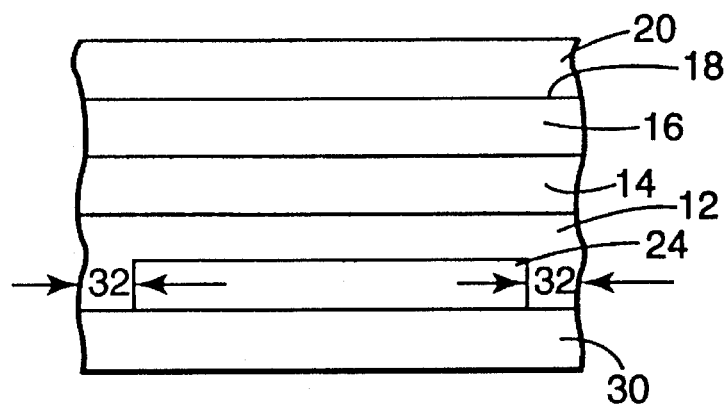
FIG. 2, shows a broken away edge view of a laminated structure depicting the encapsulation of a paper substrate between a receptor and presensitized color proofing element.

In applying the proofing element represented by FIG. 1 to a permanent paper substrate 24 on a receptor sheet 30 (as shown in FIG. 2), the element is inverted from the position that is shown in FIG. 1 so that adhesive layer 12 (with the required adhesive therein or thereover as a separate layer not shown in the Figure) is placed in contact with the paper substrate 24 so that ends 32 of the adhesive layer 12 extend beyond the paper substrate 24 and contact the receptor sheet 30 and the two bonded together. A suitable composition for receptor sheet 30 is a heat stable, waterproof white paper, such as P-350 (available from Schoeller Technical Paper Sales, Inc. of Pulaski, N.Y.) or Matchprint™ base (available from 3M, St. Paul, Minn.). Receptor sheet 30 may also be a polyester film or any other heat stable plastic material. In addition, receptor sheet 30 may be primed with a coating which is compatible with the adhesive used to encapsulate paper substrate 24. The prime layer (not shown) may be applied over the surface of receptor sheet 30 by coating or lamination.

Any paper may be used as the paper substrate 24. Preferred paper substrates have a weight less than 80 $g/m^2$, more preferably less than 70 $g/m^2$. Since the paper is supported by the receptor, the lower weight limit is not important as long as the paper has enough strength to withstand the process of laminating the color proofing element onto its surface. When adhesive layer 12 is of the type that is thermally activated, the lamination process may be accomplished by inserting the receptor sheet 30 and the inverted proofing element comprising layers represented by 12, 14, 16, 18 and 20 between a pair of nip rolls heated to 121° C. (250° F.) and passing the structure between these rolls at a linear speed of about 76.2 cm/minute (30 inches/minute). Adhesive layer 12 adheres to receptor sheet 30 at ends 32 of receptor 30, encapsulating paper substrate 24 therebetween.

Figure 3:
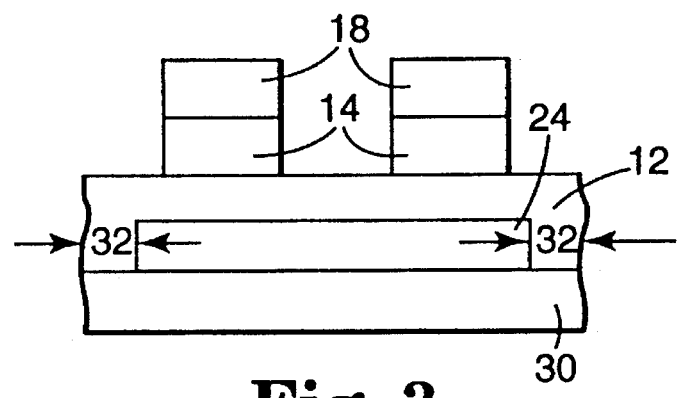
FIG. 3, shows a broken away edge view of a laminated structure having been exposed to actinic radiation through a color separation positive film, the carrier removed and the image developed with an aqueous alkali developer.

FIG. 2 is intended to illustrate this inversion process and subsequent lamination of adhesive layer 12 to receptor 30 with carrier 20, and encapsulated paper substrate 24. FIG. 3 represents an imaged structure of the present invention which has been exposed through a positive separation film, after the removal of carrier 20 and subsequently developed to form a positive image.

Because the light reacted layer(s) are alkaline sensitive, a developing solution having a pH of between 12.8 to 13.1 will act to solubilize the light-struck areas for removal. The preferred developing solution is comprised of 0.7% sodium hydroxide, 0.1% sodium carbonate and 0.10% wetting agent such as a sodium alkylnaphthalene sulfonate or a polyalkoxylated alcohol (e.g. T-DET available from Harcros Chemicals Inc., Kansas City, Kans.).

The remaining imaged structure after drying is then ready to receive a second presensitized color proofing element of a different process color than was previously laminated to receptor 30 and paper substrate 24.

The process of exposing and developing the succeeding layers with the appropriate color film separation positives results in a four color replication of the original piece of graphic art.

Having thus described the invention generally it will be specifically illustrated with the aid of the following specific examples.

EXAMPLE

Standard Matchprint™ positive color proofing elements used in the Examples were prepared in a manner similar to that described below. Each color proofing element comprises a carrier, release layer, photosensitive color layer, barrier layer and adhesive layer.

Release Layer:

A typical release layer formulation would include the following:

| | |
|---|---|
| Deionized water | 33.1 kg |
| Airvol ™ 205 polyvinyl alcohol (available from Air Products Co.) | 2677 g |
| Airvol ™ 540 polyvinyl alcohol (available from Air Products Co.) | 892 g |
| Triton ™ X-100 Surfactant (octylphenoxypolyethoxy ethanol, available from Union Carbide Chemicals and Plastics Co., Inc., Danbury, CT) | 110 g |

The release layer formulation is coated at a dry coating weight of 0.75–1.0 $g/m^2$ onto a 2 mil (0.05 mm) polyethylene terephthalate polyester carrier film.

Photosensitive Color Layers:

The release layer is then overcoated with a photosensitive color solution which is prepared in two stages. A millbase is prepared first, followed by the actual photosensitive color solution. Typical millbase formulations and photosensitive color solutions would include the following:

| | |
|---|---|
| Magenta Millbase: | |
| Modified Resinox [reaction product of Resinox ™ RS 7280 (available from Borden Chemical Co.) and 8% by weight of DDI-1410 diisocyanate (available from Henkel, Kankakee, IL)] 28.5% solids solution in MEK | 1360 g |
| Butvar ™ B-76, polyvinyl butyral resin (available from Monsanto Co., St. Louis, MO) | 43 g |
| Watchung Red Pigment 698-D (dupont) | 98 g |
| Quindo Magents RV 6803 (Allied Chemical) | 68 g |
| Cabot Regal Black Pigment 300R (available from Cabot Corp., Billerica, MA) | 1 g |
| Additional Modified Resinox | 1360 g |
| Cyan Millbase: | |
| Modified Resinox [reaction product of Resinox ™ RS 7280 (available from Borden Chemical Co.) and 11% by weight of DDI-1410 diisocyanate (available from Henkel, Kankakee, IL)] 28.5% solids solution in MEK | 871 g |
| Butvar ™ B-76, polyvinyl butyral resin (available from Monsanto Co., St. Louis, MO) | 33.5 g |
| Pigment Blue 1282 (Sun Chemicals) | 64.5 g |
| Pigment Blue 0061 (Sun Chemicals) | 69 g |
| Additional Modified Resinox | 1307 g |
| Yellow Millbase: | |
| Modified Resinox [reaction product of Resinox ™ RS 7280 (available from Borden Chemical Co.) and 5.5% by weight of DDI-1410 diisocyanate (available from Henkel, Kankakee, IL)] | 1117 g |

-continued

| | |
|---|---|
| 28.5% solids solution in MEK | |
| Butvar ™ B-76, polyvinyl butyral resin (available from Monsanto Co., St. Louis, MO) | 33 g |
| Permanent Yellow CG-11-1200 (Am. Hoechst) | 106 g |
| Diarylide Yellow Toner AAOT-1270 (Harshaw) | 27 g |
| Additional modified Resinox | 1476 g |
| Black Millbase: | |
| Modified Resinox [reaction product of Resinox ™ RS 7280 (available from Borden Chemical Co.) and 8% by weight of DDI-1410 diisocyanate (available from Henkel, Kankakee, IL)] a 29.2% solids solution in MEK | 855 g |
| Butvar ™ B-76, polyvinyl butyral resin (available from Monsanto Co., St. Louis, MO) | 34 g |
| Cabot Regal Black Pigment 300R (Cabot) | 89 g |
| Pigment Blue 1282 | 30 g |
| Quindo Magenta RV 6803 | 18 g |
| Additional Modified Resinox | 390 g |
| Magenta Color Coating Solution: | |
| Magenta millbase (diluted to 32% total solids with MEK) | 1400 g |
| 4-t-Butylphenol 215 diazo ester (available from St. Jean Photo Chemicals, Inc., St. Jean Sur Richelieu, Quebec) | 84 g |
| MEK (methyl ethyl ketone) | 866 g |
| Cyan Color Coating Solution: | |
| Cyan millbase (diluted to 32% total solids with MEK) | 1400 g |
| 4-t-Butylphenol 215 diazo ester (available from St. Jean Photo Chemicals, Inc., St. Jean sur Richelieu, Quebec) | 95 g |
| MEK | 863 g |
| Yellow Color Coating Solution: | |
| Yellow millbase (diluted to 28% total solids with MEK) | 1400 g |
| 4-t-Butylphenol 215 diazo ester (available from St. Jean Photo Chemicals, Inc., St. Jean sur Richelieu, Quebec) | 83 g |
| MEK | 582 g |
| Black Color Coating Solution: | |
| Black millbase (diluted to 34% total solids with MEK) | 1400 g |
| 4-t-Butylphenol 215 diazo ester (available from St. Jean Photo Chemicals, Inc. St. Jean Sur Richelieu, Quebec) | 105 g |
| MEK | 1033 g |

Each of the color coating solutions was coated onto the previously coated release layer to a reflectance density appropriate to achieve the target color rendition in the final proof. One skilled in the art will appreciate the necessity of adjusting the various components of the color layer so as to obtain the desired exposure time and color hue with each pigment system.

Barrier Layer:

An optional barrier layer may be included in the construction. A typical formulation for the barrier layer would consist of a 1.5% by weight solution of the reaction product of Resinox™ RS 7280 (available from Borden Chemical Co.) with 1,2-Naphthoquinone-2-diazido-5-sulfonyl chloride (available from Andrews Paper & Chemical Co., Inc., Port Washington, N.Y.) in isopropyl alcohol. The barrier layer solution was coated to a dry coating weight of 0.2–0.3 g/m².

Adhesive Layer:

A typical adhesive coating solution would include the following:

| | |
|---|---|
| Pliolite ™ S5A (styrene/butadiene copolymer, available from Goodyear Tire & Rubber Co., Akron, OH) | 1500 g |
| Pliolite ™ AC (styrene/acrylate copolymer, available from Goodyear Tire & Rubber Co., Akron, OH) | 1000 g |
| Toluene | 7500 g |

The adhesive coating solution is coated to achieve a dry coating thickness of about 14 microns.

The selection of the adhesive or composition of the barrier is layer is not as important for the subsequent layers as they do not have to encapsulate the paper and resist penetration by developer. The adhesive materials and components for the barrier layers of U.S. Pat. Nos. 4,260,673 and 4,889,787 are useful in this respect.

Cyan, magenta, yellow and black presensitized proofing sheets are prepared by mixing the appropriate color millbases to achieve the desired color. Those skilled in the art would know how to combine the proper millbases to match a particular color target. The following are a few of the many pigments known in the art (C.I. meaning, color index):

Blues—pigment blue 15 (C.I. 74160)

Watchung Red—pigment red 48 (C.I. 15865)

Yellow—D-2840—pigment yellow 17 (C.I. 21105)

Quindo Magenta—RV-6803—pigment red 122 (C.I. 73915)

Alkali Resistant Red RT-539D—pigment red 23 (C.I. 12355)

Benzidene Yellow 4T-564D—pigment yellow 14 (C.I. 21095)

Monastral Green GT761-D—pigment green 7 (C.I. 74260)

One skilled in the art will also appreciate the necessity of adjusting the various components of the color layer so as to obtain the desired exposure time with each pigment system. Because lower amounts of diazo oxide give shorter exposure times to actinic radiation, a workable diazo oxide range of from 17 to 45% of the reacted urethane has been found to be acceptable. For the yellow, cyan and black pigmented coating solutions, in one instance, an amount of diazo oxide equal to 25% of the reacted urethane was chosen, whereas the magenta coating solution required 33% diazo oxide.

Primed Matchprint™ Base:

The receptor used in the following examples was prepared by applying a prime onto a Matchprint™ base prior to lamination of the paper substrate onto the base. The following prime coating solution was used:

| | |
|---|---|
| Primal ™ E581 | 100 g |
| 1% acetic acid in water | 20 g |
| TEXANOL ™ (2,2,4-trimethyl-1,3-pentanediol-monoisobutyrate, available from Eastman Chemical Co., Kingsport, TN) | 3 g |
| Water | 27 g |
| Tetronic ™ 701 (alkoxylated diamine, available from BASF Corp. Chemicals Div., Parsippany, NJ) | 0.17 g |
| Water | 20 g |
| Polymethyl methacrylate beads (preparation described in U.S. Pat. No. 2,701,245) | 0.70 g |

The solution was coated onto Matchprint™ base (available from 3M, St. Paul, Minn.) using a #6 wire wound bar. After drying for 2 minutes at 100° C. a dry coating thickness of 3.5 microns was achieved.

EXAMPLE 1

This example illustrates the effect of adhesive choice on the ability of the adhesive to protect the paper substrate during development and overall quality of a final color proofing composite. Pliolite™ resins (available from Goodyear Tire & Rubber Co., Akron, Ohio) were used in this evaluation. Table 1 summarizes the characteristics of the Pliolite™ resins evaluated.

TABLE 1

| Resin | Polymer Type | MW* | Tg** |
| --- | --- | --- | --- |
| Pliolite ™ TM S5A | Styrene/butadiene | 163,005 | 55° C. |
| Pliolite ™ AC | Styrene/acrylate | 138,000 | 57° C. |
| Pliolite ™ AC80 | Styrene/acrylate | 77,400 | 46° C. |

*MW represents the weight average Molecular Weight
**Tg represents the Glass Transition Temperature The following two adhesive solutions were prepared:

Solution A consisted of 15% by weight of Pliolite™ S5A and 10% by weight of Pliolite™ AC in toluene.

Solution B consisted of 17.9% by weight of Pliolite™ AC80, 6.0% by weight of Pliolite™ AC, 1.2% by weight Santicizer™ 278 (available from Monsanto Co., St. Louis, Mo.) in toluene.

Both solutions were coated onto a 50 microns polyester film having been coated with the release layer coating described above. After drying for 3 minutes at 100° C., a dry coating thickness of about 14 microns was obtained.

A 50 g/m² paper substrate was laminated onto the primed Matchprint™ base described above. Polyester films precoated with the release layer described above were then coated with solutions A and B. The coated films were respectively laminated to the paper substrate and primed Matchprint™ base and processed to remove the polyvinyl alcohol layer.

A 4-color proof was also made using the Matchprint™ color proofing elements described above.

The films coated with adhesive solution A had poor cohesion and poor adhesion to the primed Matchprint™ base. The developer had a tendency to penetrate at the edges of the paper substrate.

The films coated with adhesive solution B gave a better result but a slight tendency of developer penetration at the edges of the paper substrate was observed.

The four color proof gave acceptable lamination quality results. The appearance of microbubbles (trapped pockets of air between the edge of the image and the subsequent laminated adhesive layer) was low.

EXAMPLE 2

The following example illustrates the use of alkylacrylic and alkylmethacrylic resins for the adhesive composition. Paraloid™ acrylic resins (available from Rohm & Haas, Philadelphia, Pa.) were used to demonstrate this effect. Table 2 summarizes the characteristics of the Paraloid™ resins used.

TABLE 2

| Resin | Polymer Type | Glass Transition Temperature |
| --- | --- | --- |
| Paraloid ™ B44 | Methyl methacrylate | 60° C. |
| Paraloid ™ B48 | Methyl methacrylate | 50° C. |
| Paraloid ™ B66 | Methyl methacrylate/ Butyl methacrylate | 50° C. |
| Paraloid ™ B67 | Isobutyl methacrylate | 50° C. |
| Paraloid ™ B72 | Ethyl methacrylate | 40° C. |

A 25% solids solution in toluene was prepared for each the Paraloid™ resins described in Table 2. Each adhesive was tested following the same procedure as described in Example 1.

A 4-color proof was also made using the Matchprint™ color proofing elements described above.

Table 3 summarizes the results observed for each Paraloid™ resin.

TABLE 3

|  | B44 | B48 | B66 | B67 | B72 |
| --- | --- | --- | --- | --- | --- |
| Coatability | Good | Good | Good | Difficult | Good |
| Resistance to Developer | Good | Good | Marginal | Marginal | Good |
| Adhesion on Paper | Poor | Good | Good | Good | Good |
| Film Cohesion | Marginal | Good | Poor | Poor | Marginal |
| Proof Visual Effect | — | Good | Good | — | Good |
| Microbubbles | — | OK | Very Slight | — | Slight |

EXAMPLE 3

The following example illustrates the use of Primal™ E581 acrylic latex from Rohm & Haas Co., Philadelphia, Pa. Primal™ E581 was developed for paper and cardboard coating applications having high gloss and excellent adhesion to paper. Primal™ E581 has the following characteristics:

Solids content: 46%

Density: 1.05

Glass Transition Temperature: −45° C.

An unprimed 50 microns polyester film was coated with Primal™ E581 using a #20 wire-wound bar to achieve a 36 microns wet coating thickness. The coating was dried in an oven for 3 minutes at 100° C. resulting in a clear coating layer having a dry coating weight of 17 g/m².

A laminate structure was made by laminating the Primal™ coated polyester film over a 51 g/m² paper substrate that was laminated onto a primed Matchprint™ base. An acceptable 4-color proof was then made using the Matchprint™ color proofing elements described above onto the Primal™ laminated structure.

EXAMPLE 4

This example illustrates the effect of adhesive coating weight on performance. Paraloid™ B48 and Primal™ E581 adhesive solutions were coated onto polyester film previously coated with a release layer. After drying for 3 minutes at 100° C., the different resin layers were laminated onto the paper substrate that was laminated onto the primed Matchprint™ base. The resistance to the aqueous developer was then evaluated. Table 4 summarizes the results observed for Paraloid™ B48 and Primal™ E581 adhesive coatings at different coating weights.

TABLE 4

| Resin | Total Solids | Dry coating weight (g/m²) | Coatability | Resistance to developer |
| --- | --- | --- | --- | --- |
| Paraloid ™ B48 | 22% | 15 | Good | Good |
| Paraloid ™ B48 | 18% | 15 | Good | Good |
| Paraloid ™ B48 | 18% | 10 | Good | Poor |
| Paraloid ™ B48 | 12% | 10 | Poor | Poor |
| Paraloid ™ B48 | 12% | 7.5 | Poor | Poor |
| Paraloid ™ B48 | 12% | 6 | Good | Poor |
| Primal ™ E581 | 46% | 17 | Good | Excellent |
| Primal ™ E581 | 46% | 11 | Good | Excellent |
| Primal ™ E581 | 35% | 8.5 | Good | Excellent |
| Primal ™ E581 | 25% | 6 | Marginal | Good |

Primal™ E581 shows better latitude than the Paraloid™ B48 adhesive. The results also show that the resistance to the developer decreases at lower adhesive coating weights regardless of the adhesive choice.

EXAMPLE 5

This example illustrates the effect of incorporating the acrylic adhesive into the color proofing element.

A 50 microns polyester film precoated with the release layer, cyan color layer and barrier layer described earlier was overcoated with a solution of 25% by weight Paraloid™ B48 in toluene using a #30 wire wound bar. The coating was then dried at 100° C.

A 51 g/m² paper substrate was laminated onto primed Matchprint™ base. The cyan proofing element coated with Paraloid™ B48 was then laminated onto the paper/primed Matchprint™ base composite. Caution has to be taken in order to have a good overlapping of the cyan film on the paper. The laminated structure was then exposed and processed. Magenta, Yellow and Black color proofing elements as described earlier were then laminated onto the cyan imaged structure, exposed and processed in sequence to form a four color composite proof.

The same 51 g/m² paper substrate was printed with the same image on a printing press. The four color composite proof provided a good match to the printed paper, especially when deglossed.

Reasonable variations and modifications are possible from the foregoing disclosure without departing from either the spirit or scope of the invention as claimed.

What is claimed is:

1. A method of forming a color proofing medium using a presensitized color proofing element, comprising a carrier sheet having a smooth release surface;

a color coating of a diazo oxide and a pigmented resin compound in clinging engagement with but not adhesively bonded to said release surface of said carrier sheet; said color coating being solubilizable in an aqueous alkali developing medium upon exposure to actinic radiation but not solubilizable in said developing medium prior to exposure to actinic radiation; and a clear adhesion layer firmly attached to said color coating, said adhesive layer comprising an acrylic resin being insoluble in said developing medium, the method comprising the steps of providing a receptor sheet, placing a paper substrate on said receptor sheet so that continuous areas of said receptor sheet extend completely around said paper, exposing at least two millimeters of receptor sheet past all edges of said paper, applying said presensitized proofing element over said paper to form an unbonded structure so that continuous areas of said proofing element extend completely around said paper, exposing at least two millimeters of said proofing element to said receptor sheet, heating and pressing said unbonded structure to adhere exposed areas of said proofing element to exposed areas of said receptor sheet to form said color proofing medium.

2. The method of claim 1 wherein both of said areas extend at least 3 millimeters past the edge of said paper.

3. The method of claim 1 wherein both of said areas extend at least 4 millimeters past the edge of said paper.

4. The method of claim 1 wherein both of said areas extend at least 5 millimeters past the edge of said paper.

5. The method of claim 1 wherein said acrylic resin comprises a copolymer of acrylic monomers.

6. The method of claim 5 wherein said copolymer comprises a copolymer of at least two monomers selected from the group consisting of acrylic acid, methacrylic acid, methylmethacrylate, ethylmethacrylate, iso-propylmethacrylate, n-butylmethacrylate, isobutylmethacrylate, and isobutylacrylate.

7. The method of claim 2 wherein said acrylic resin comprises a copolymer of at least two monomers selected from the group consisting of acrylic acid, methacrylic acid, methylmethacrylate, ethylmethacrylate, iso-propylmethacrylate, n-butylmethacrylate, isobutylmethacrylate, and isobutylacrylate.

8. The method of claim 3 wherein said acrylic resin comprises a copolymer of at least two monomers selected from the group consisting of acrylic acid, methacrylic acid, methylmethacrylate, ethylmethacrylate, iso-propylmethacrylate, n-butylmethacrylate, isobutylmethacrylate, and isobutylacrylate.

9. The method of claim 4 wherein said acrylic resin comprises a copolymer of at least two monomers selected from the group consisting of acrylic acid, methacrylic acid, methylmethacrylate, ethylmethacrylate, iso-propylmethacrylate, n-butylmethacrylate, isobutylmethacrylate, and isobutylacrylate.

10. The method of claim 1 wherein said photosensitized color proofing element has a release liner attached to said adhesive layer.

11. A method of forming a color proofing medium using a presensitized color proofing element, comprising a carrier sheet having a smooth release surface;

a color coating of a diazo oxide and a pigmented resin compound in clinging engagement with but not adhesively bonded to said release surface of said carrier sheet; said color coating being solubilizable in an aqueous alkali developing medium upon exposure to actinic radiation but not solubilizable in said developing medium prior to exposure to actinic radiation; and a clear adhesion layer firmly attached to said color coating, said adhesive layer comprising an acrylic resin being insoluble in said developing medium, the method comprising the steps of providing a receptor sheet, placing a paper substrate on said receptor sheet so that continuous areas of said receptor sheet extend completely around said paper, exposing at least two millimeters of receptor sheet past all edges of said paper, applying said presensitized proofing element over said paper to form an unbonded structure so that continuous areas of said proofing element extend completely around said paper, exposing at least two millimeters of said proofing element to said receptor sheet, heating and pressing said unbonded structure to adhere exposed areas of said proofing element to exposed areas of said receptor sheet to form said color proofing medium, where after adhering said unbonded structure said method further comprises, a) exposing said proofing element through a color separation positive corresponding to the pigment of said color coating to actinic radiation whereby the exposed diazo oxide and resin mixture of said color coating is rendered soluble in an aqueous alkaline developing medium to create a latent image; and then b) developing said image with an aqueous alkaline developing medium whereby exposed diazo oxide and resin mixture in said color coating is removed and unexposed diazo oxide and resin in said color coating remains.

12. The method of claim 11 wherein after developing c) bonding the adhesive layer of an additional presensitized element having a different color pigment in said color coating to the developed first presensitized element;

d) repeating steps a), b), and c) with at least one subsequent separation positive being in register with said developed first presensitized element.

13. The method of claim 12 wherein at least three color separations are provided in register by said method.

14. The method of claim 13 wherein four colors are provided in register by said method.

15. The method of claim 11 wherein said receptor sheet extends beyond all edges of said proofing element.

16. The method of claim 14 wherein said receptor sheet extends beyond all edges of said proofing element.

17. A method of forming a color proofing medium using a presensitized color proofing element, comprising a carrier sheet having a smooth release surface;

a color coating of a diazo oxide and a pigmented resin compound in clinging engagement with but not adhesively bonded to said release surface of said carrier sheet;

a barrier layer which is distinct or blended into said color coating comprising a mixture or reaction product of a resin and a diazo oxide bonded to the surface of said color coating; said color coating and said barrier layer being solubilizable in an aqueous alkali developing medium upon exposure to actinic radiation but not solubilizable in said developing medium prior to exposure to actinic radiation; and a clear adhesion layer firmly attached to said barrier layer, said adhesive layer comprising an acrylic resin being insoluble in said developing medium, the method comprising the steps of providing a receptor sheet, placing a paper substrate on said receptor sheet so that continuous areas of said receptor sheet extend completely around said paper, exposing at least two millimeters of receptor sheet past all edges of said paper, applying said presensitized proofing element over said paper to form an unbonded structure so that continuous areas of said proofing element extend completely around said paper, exposing at least two millimeters of said proofing element to said receptor sheet, heating and pressing said unbonded structure to adhere exposed areas of said proofing element to exposed areas of said receptor sheet.

18. The method of claim 17 wherein both of said areas extend at least 3 millimeters past the edge of said paper.

19. The method of claim 17 wherein both of said areas extend at least 4 millimeters past the edge of said paper.

20. The method of claim 17 wherein both of said areas extend at least 5 millimeters past the edge of said paper.

21. The method of claim 17 wherein said acrylic resin comprises a copolymer of acrylic monomers.

22. The method of claim 21 wherein said copolymer comprises a copolymer of at least two monomers selected from the group consisting of acrylic acid, methacrylic acid, methylmethacrylate, ethylmethacrylate, iso-propylmethacrylate, n-butylmethacrylate, isobutylmethacrylate, and isobutylacrylate.

23. The method of claim 18 wherein said acrylic resin comprises a copolymer of at least two monomers selected from the group consisting of acrylic acid, methacrylic acid, methylmethacrylate, ethylmethacrylate, iso-propylmethacrylate, n-butylmethacrylate, isobutylmethacrylate, and isobutylacrylate.

24. The method of claim 19 wherein said acrylic resin comprises a copolymer of at least two monomers selected from the group consisting of acrylic acid, methacrylic acid, methylmethacrylate, ethylmethacrylate, iso-propylmethacrylate, n-butylmethacrylate, isobutylmethacrylate, and isobutylacrylate.

25. The method of claim 20 wherein said acrylic resin comprises a copolymer of at least two monomers selected from the group consisting of acrylic acid, methacrylic acid, methylmethacrylate, ethylmethacrylate, iso-propylmethacrylate, n-butylmethacrylate, isobutylmethacrylate, and isobutylacrylate.

26. The method of claim 17 wherein said photosensitized color proofing element has a release liner attached to said adhesive layer.

27. A method of forming a color proof using a presensitized color proofing element, comprising a carrier sheet having a smooth release surface;

a color coating of a diazo oxide and a pigmented resin compound in clinging engagement with but not adhesively bonded to said release surface of said carrier sheet;

a barrier layer which is distinct or blended into said color coating comprising a mixture or reaction product of a resin and a diazo oxide bonded to the surface of said color coating; said color coating and said barrier layer being solubilizable in an aqueous alkali developing medium upon exposure to actinic radiation but not solubilizable in said developing medium prior to exposure to actinic radiation; and a clear adhesion layer firmly attached to said barrier layer, said adhesive layer comprising an acrylic resin being insoluble in said developing medium, the method comprising the steps of providing a receptor sheet, placing a paper substrate on said receptor sheet so that continuous areas of said receptor sheet extend completely around said paper, exposing at least two millimeters of receptor sheet past all edges of said paper, applying said presensitized proofing element over said paper to form an unbonded structure so that continuous areas of said proofing element extend completely around said paper, exposing at least two millimeters of said proofing element to said receptor sheet, heating and pressing said unbonded structure to adhere exposed areas of said proofing element to exposed areas of said receptor sheet where after adhering said unbonded structure, a) exposing said proofing element through a color separation positive corresponding to the pigment of said color coating to actinic radiation whereby the exposed diazo oxide and resin mixture of said barrier layer and said color coating is rendered soluble in an aqueous alkaline developing medium to create a latent image; and then b) developing said latent image with an aqueous alkaline developing medium whereby exposed diazo oxide and resin mixture in said barrier layer and associated color coating is removed and unexposed diazo oxide and resin in said barrier layer and color coating remains.

28. The method of claim 27 wherein after developing c) bonding the adhesive layer of an additional presensitized element having a different color pigment in said color coating to the developed first presensitized element;

d) repeating steps a), b), and c) with at least one subsequent separation positive being in register with said developed first presensitized element.

29. The method of claim 28 wherein at least three color separations are provided in register by said process.

30. The method of claim 29 wherein four colors are provided in register by said method.

31. The process of claim 17 wherein said receptor sheet extends beyond all edges of said proofing element.

32. The process of claim 30 wherein said receptor sheet extends beyond all edges of said proofing element.

* * * * *